United States Patent [19]
Bui et al.

[11] Patent Number: 5,612,627
[45] Date of Patent: Mar. 18, 1997

[54] METHOD FOR EVALUATING THE EFFECT OF A BARRIER LAYER ON ELECTROMIGRATION FOR PLUG AND NON-PLUG INTERCONNECT SYSTEMS

[75] Inventors: Nguyen D. Bui, San Jose; John T. Yue, Los Altos; Van Pham, Milpitas, all of Calif.

[73] Assignee: Advanced Micro Devices, Inc., Sunnnyvale, Calif.

[21] Appl. No.: 348,645

[22] Filed: Dec. 1, 1994

[51] Int. Cl.⁶ .................................................. G01R 27/26
[52] U.S. Cl. .......................... 324/766; 324/716; 324/719
[58] Field of Search ............................... 324/158.1, 73.1, 324/765, 719, 766, 713, 703, 716; 437/8; 29/825; 257/40, 48, 753

[56] References Cited

U.S. PATENT DOCUMENTS

| | | | |
|---|---|---|---|
| 3,474,530 | 10/1969 | Ainslie et al. | 324/158.1 |
| 3,878,442 | 4/1975 | Bhatt | 29/825 |
| 4,483,629 | 11/1984 | Schwarz et al. | 324/158.1 |
| 4,652,812 | 3/1987 | Gimpelson et al. | 324/158.1 |
| 4,970,574 | 11/1990 | Tsunenari | 257/753 |
| 5,291,142 | 3/1994 | Ohmi | 324/158.1 |
| 5,420,513 | 5/1995 | Kimura | 324/719 |

*Primary Examiner*—Vinh P. Nguyen
*Attorney, Agent, or Firm*—Skjerven, Morrill, MacPherson, Franklin & Friel; Paul J. Winters; H. Donald Nelson

[57] ABSTRACT

A substantially constant current is conducted in a first direction through an interconnect structure having a barrier layer to determine the lifetime of the structure in the first current direction. A substantially identical current is conducted in a second direction through a substantially identical interconnect structure to determine the lifetime of the structure in the second current direction. These tests are repeated for identical structures but having different barrier layer thicknesses. The results of these lifetime tests are compared to determine the barrier layer's effect on electromigration in the structure, which can be used to design the barrier layer to optimize the structure's lifetime and speed.

36 Claims, 5 Drawing Sheets

METHOD FOR EVALUATING THE EFFECT OF A BARRIER LAYER ON ELECTROMIGRATION FOR PLUG AND NON-PLUG INTERCONNECT SYSTEMS

FIELD OF THE INVENTION

This invention relates to test methods used in integrated circuit manufacturing, and particularly, to test methods for analyzing the effect of a barrier layer on electromigration for plug and non-plug interconnect systems.

BACKGROUND

Many integrated circuits have two or more metal layers for interconnecting devices in the integrated circuit. FIG. 1 shows a cross-sectional view of a two metal layer interconnect structure 100 having a metal-1 layer 110, a metal-2 layer 120, and a via 130 for interconnecting metal-1 110 and metal-2 layer 120. Via 130 has a barrier layer 132 separating metal-1 layer 110 and metal-2 layer 120. Barrier layer 132 is formed by a layer 134 and a layer 136, which in this example, are made of TiN for adhesion of Metal-2 layer 120 and anti-reflective coating (ARC) for Metal-1 layer 110, respectively. Metal-1 and Metal-2 layers 110 and 120 are made of Al or Al alloy.

One of the failure modes of structure 100 is caused by electromigration. Electromigration refers to the physical displacement or scattering of atoms of the conducting medium (e.g., the Al of the metal layers) arising from collisions with electrons moving in the opposite direction of the current. As electromigration occurs, the resistance of the affected metal layer can increase to the point of failure.

Also, barrier layer 132 can be a problem because barrier layer 132 causes via 130 to be more resistive than a purely metal via. Consequently, the speed at which signals propagate through the metal/barrier/metal structure is decreased. The resistance of barrier layer 132 increases with thickness. However, the lifetime of the integrated circuit also increases with barrier thickness (discussed below in conjunction with FIG. 2). Thus, the designer can trade off speed for lifetime by varying the barrier layer thickness.

FIG. 2 illustrates the effects of electromigration near barrier layer 132. A current $I_1$ is conducted from metal-2 layer 120 to metal-1 layer 110 though barrier layer 132. Thus, electrons are moving in the direction opposite of the current; i.e., from metal-1 layer 110 to metal-2 layer 120.

The current density is generally greatest along the "line of least resistance", represented by arrow 200. Thus, the greatest density of the "electron wind" is generally along arrow 200 in the opposite direction. Due to electromigration, Al atoms in metal-2 layer 120 tend to be scattered from areas of metal-2 layer 120 having high current density. As a result, voids 210 in metal-2 layer 120 are created in areas along arrow 200. Consequently, the area (perpendicular to current flow) of metal-2 layer 120 is decreased, which increases the resistance of metal-2 layer 120. As more electromigration occurs, more voids are created causing the resistance of metal-2 layer 120 to increase to a point where the device is considered to have failed.

FIG. 2 also illustrates the conventional method for determining the lifetime of such structures. Current is conducted in one direction until the resistance reaches a predetermined failure criterion. In this example, the current flows from metal-2 layer 120 to metal-1 layer 110. This method measures the lifetime of the structure, but cannot determine the effects of the barrier on the lifetime. For example, because another factor may be the limiting factor on lifetime, varying the barrier's thickness may only change the observed lifetime a relatively small amount when using the conventional method.

SUMMARY

According to one embodiment of the present invention, a substantially constant current is conducted in a first direction through a first metal interconnect structure having a barrier layer to determine the lifetime of the structure in the first current direction. A substantially identical current is conducted in a second direction through a second metal interconnect structure that is substantially identical to the first metal interconnect structure to determine the lifetime of the structure in the second current direction. These tests are repeated for substantially identical structures but having different barrier layer thicknesses. The results of these lifetime tests are compared to determine the barrier layer's effect on electromigration in the structure, which can be used to design the barrier layer to optimize the structure's lifetime and speed.

DETAILED DESCRIPTION

Figure 1:
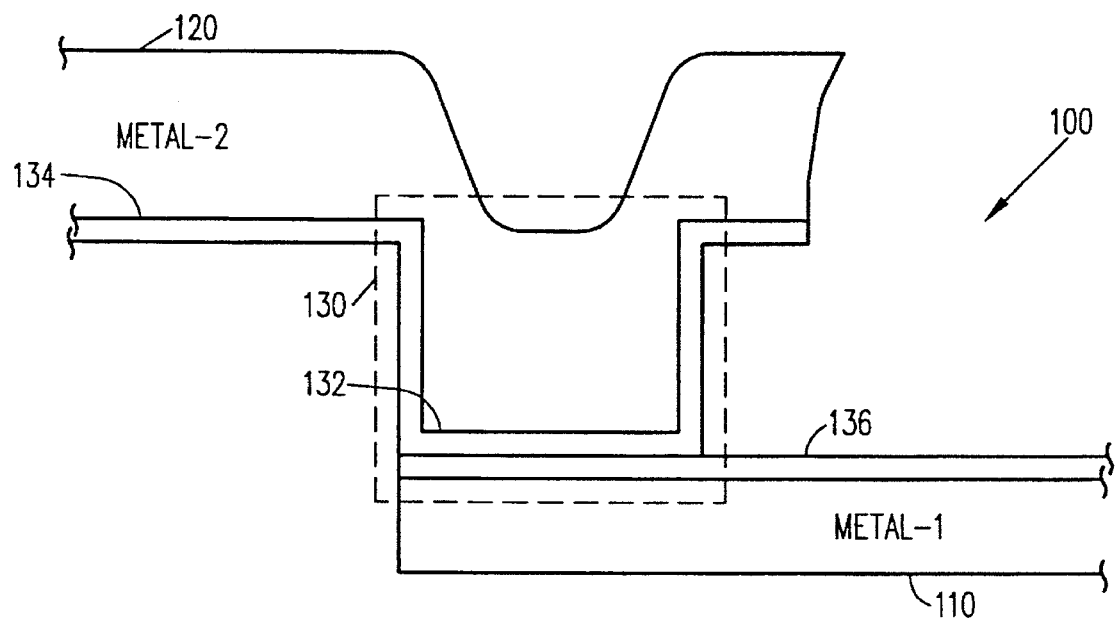
FIG. 1 shows cross-sectional view of a metal interconnect structure having a via with a barrier layer.
Figure 2:
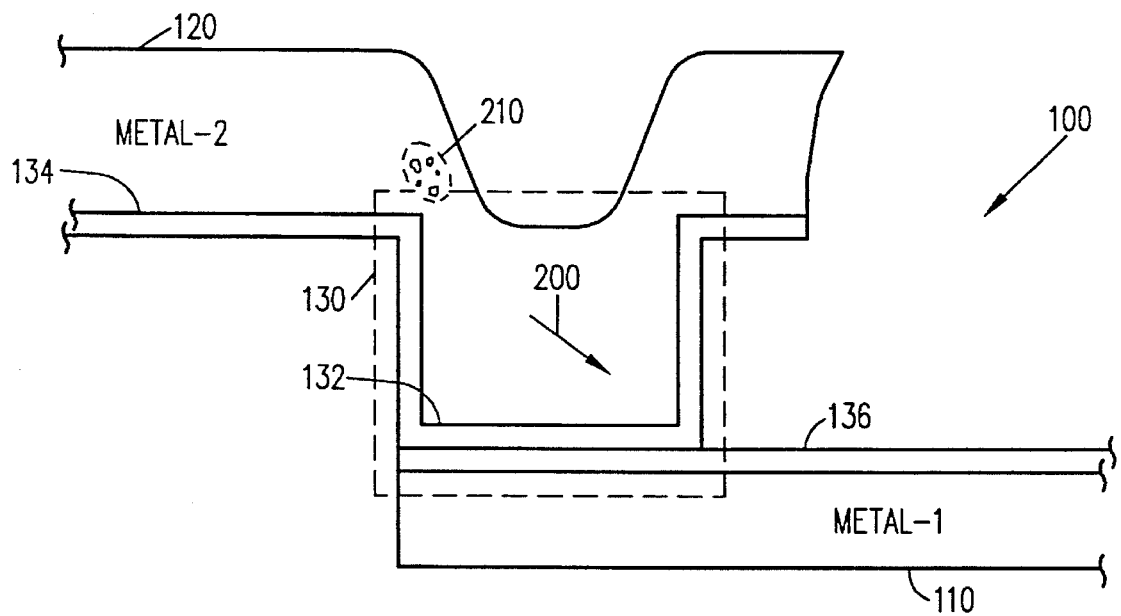
FIG. 2 illustrates electromigration in the metal interconnect structure of FIG. 1.
Figure 3A:
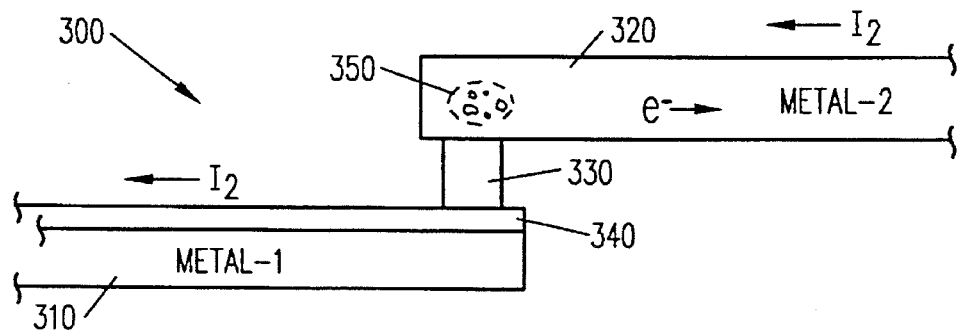
FIGS. 3A–8 illustrate a test methodology testing a via with a plug according to one embodiment of the present invention.

FIG. 3A shows a metal interconnect structure 300 with a conductive plug 330 connecting a metal-1 layer 310 with a metal-2 layer 320. In this example, plug 330 is comprised of tungsten. A barrier layer 340 is located between plug 330 and metal-1 layer 310.

To stress structure 300, a substantially constant current $I_2$ of approximately 75 mA is conducted in the "forward" direction from metal-2 layer 320 to metal-1 layer 310, while the structure is heated to 175° C. As a result, electrons move from metal-1 layer 310 to metal-2 layer 320, causing voids 350 in metal-2 layer 320. The time-to-failure is measured. In this example, structure 300 fails when the increase in the structure's resistance exceeds 20% of the structure's initial resistance. A large number of structures substantially identical to structure 300 are tested to obtain statistical data.

Figure 3B:
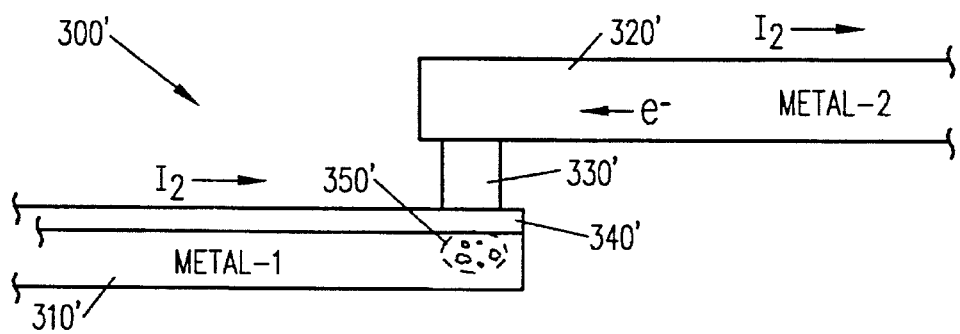

Similarly, FIG. 3B shows a substantially identical metal interconnect structure 300' with a plug 330' and a barrier layer 340' connecting a metal-1 layer 310' with a metal-2 layer 320'. Structure 300' is tested under substantially identical conditions and the same failure criterion as structure 300 (FIG. 3A), except that current $I_2$ is conducted in the "reverse" direction. Consequently, electrons move from metal-2 layer 320' to metal-1 layer 310', causing voids 350' in metal-1 layer 310'. A large number of structures substantially identical to structure 300' are tested to obtain statistical data.

Figure 4:
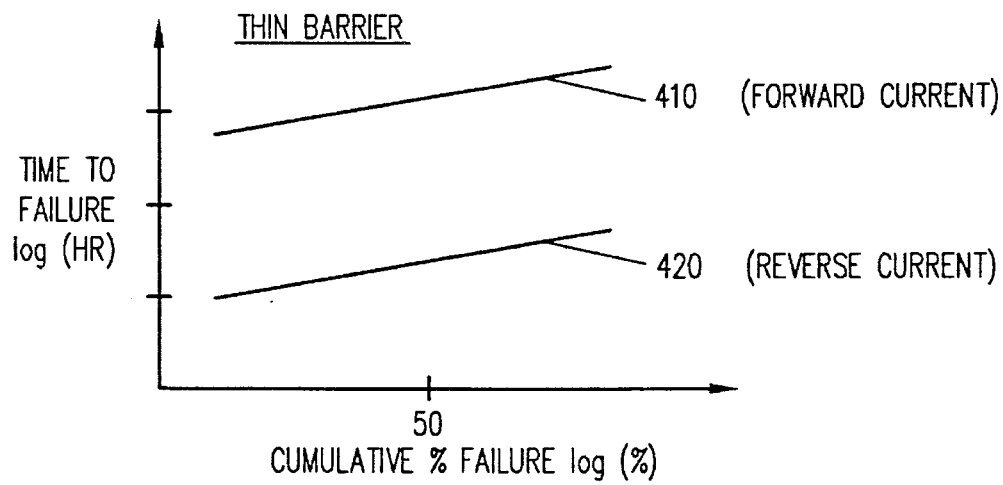

FIG. 4 shows the statistical results of the tests described above in conjunction with FIGS. 3A and 3B (i.e., the "thin barrier" structure). Curve 410 represents the time-to-failure as a function of cumulative % failure of the structures tested according to structure 300 (i.e., forward current). Similarly, curve 420 represents the time-to-failure as a function of cumulative % failure of the structures tested according to structure 300' (i.e., reverse current). FIG. 4 shows that with the reverse current, it takes approximately 2 orders of magnitude longer for approximately 50% of the structures to fail with the forward current as compared to the reverse current. This embodiment of the present invention recognizes that a metal interconnect structure can have a different lifetime depending on the direction of the stress current. Accordingly, it is important that a structure be tested in both current directions to obtain accurate lifetime test results.

By testing different barrier thickness in both directions, the effects of barrier thickness can be characterized, thereby allowing the designer to optimize barrier thickness for structure lifetime and speed.

Figure 5A:
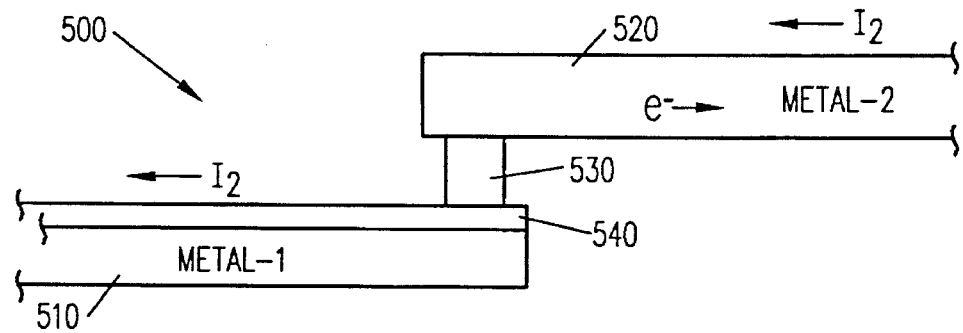
Figure 5B:
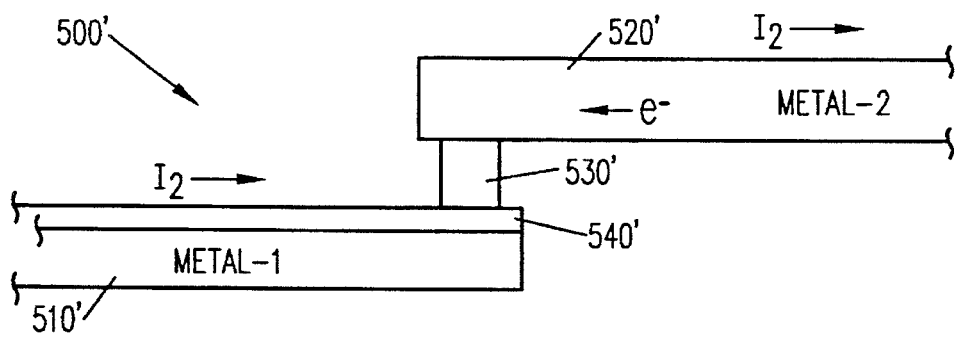

FIGS. 5A and 5B show structures substantially identical to structures 3A and 3B, respectively, with the exception that barrier layers 540 and 540' are approximately twice the thickness of barrier layers 340 and 340'. Structures 500 and 500' are tested under substantially identical conditions as structures 300 and 300'.

Figure 6:
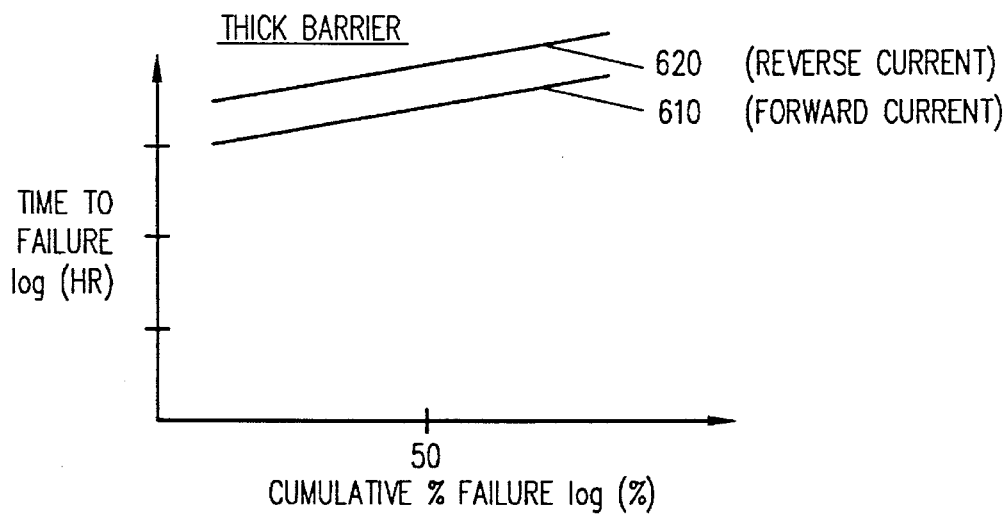
Figure 7A:
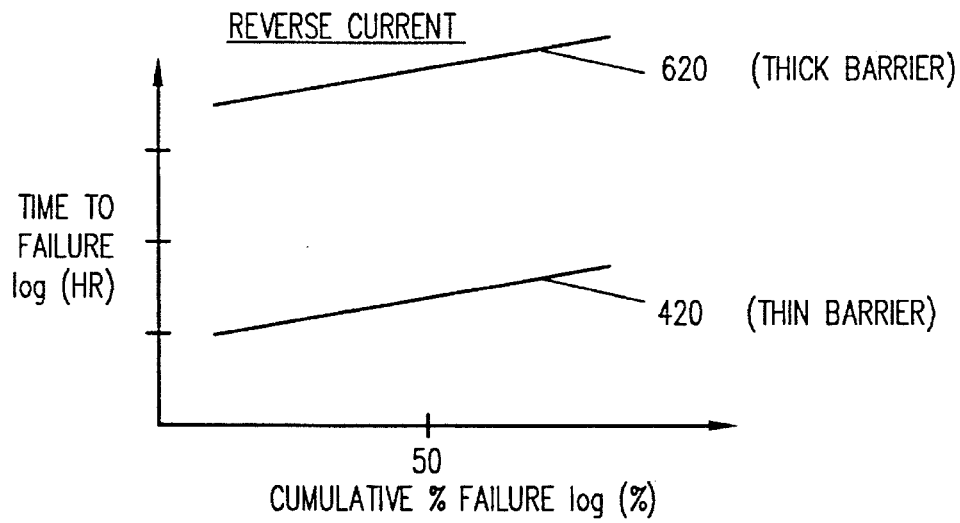

The lifetime data obtained from the testing of structures 500 and 500' are plotted in FIG. 6 (i.e., the "thick barrier" structure). Curve 610 shows the lifetime in the forward current direction, whereas curve 620 shows the lifetime in the reverse current direction. FIG. 6 shows that by increasing barrier thickness, the lifetime of structure 500' is greatly increased. This is shown more clearly in FIG. 7A. Curve 410 (FIG. 4) and curve 620 (FIG. 6) are shown on the same plot in FIG. 7A. By approximately doubling the barrier layer thickness, the lifetime of the structure was increased by approximately two orders of magnitude.

The thickness of the barrier layer affects electromigration of the plug interconnect system as follows. In general, the resistance of the barrier layer increases with barrier thickness. Further, as the resistance of the barrier layer increases, the barrier layer causes the current density across the barrier layer to be more uniform. Consequently, as the current density becomes more uniform, the density of the electron wind is decreased. As a result, electromigration is slowed, thereby increasing the lifetime of the structure. Thus, in general, the lifetime of the structure increases with the barrier layer's thickness.

Figure 7B:
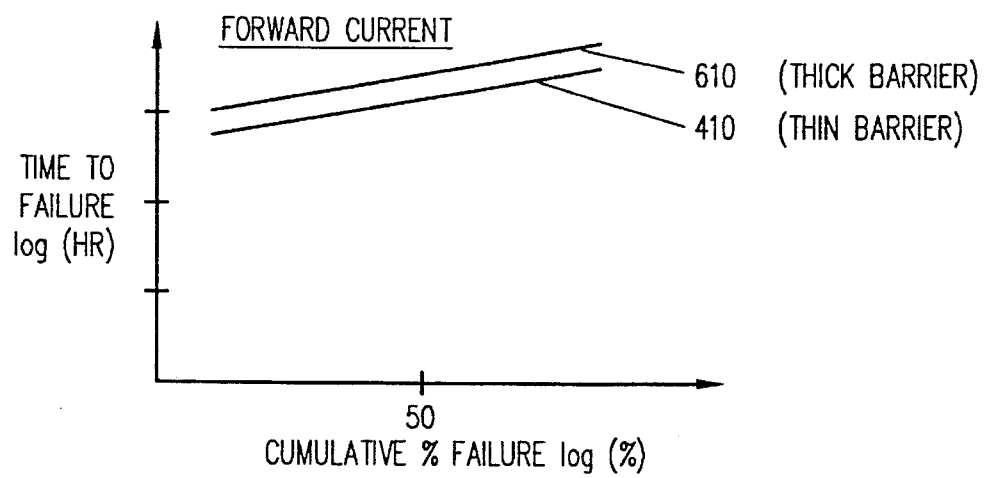

However, in the forward current direction, barrier layer thickness has a less noticeable effect as shown in FIG. 7B. Curve 610 (FIG. 6) and curve 410 (FIG. 4) are shown in the same plot in FIG. 7B and represent the lifetime of the structure in the forward current direction. Increasing barrier layer thickness resulted in only modest increase in lifetime in the forward current direction. This is due in part to the fact that there is no barrier layer separating plug 530 from metal-2 layer 520 (see FIG. 5A). Consequently, the effect of barrier thickness on lifetime is dissipated in the forward current direction.

Figure 8:
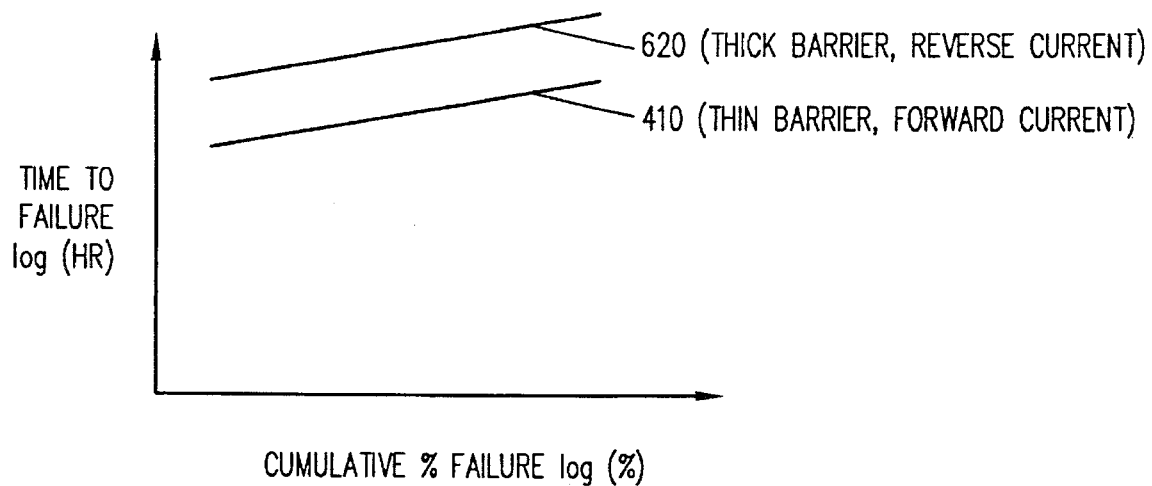

FIG. 8 shows curve 620 (FIG. 6) representing the lifetime with a thick barrier in the reverse current direction plotted together with curve 410 (FIG. 4) representing the lifetime with a thin barrier in the forward current direction. It is clear that the barrier layer thickness can be optimized for lifetime and speed by designing the barrier thickness to be less than the thickness of barrier layer 540' (FIG. 5B) but greater than barrier layer 340 (FIG. 3A). Graphically, this will cause curve 620 to "drop" while causing curve 410 to "rise". At some thickness, the curves will meet, which represents the optimal thickness for the structure's lifetime and speed.

Thus, by using the testing methods describe above, those skilled in the art, for a given process, will be able to characterize the effects of barrier thickness to optimize the thickness for a desired parameter.

Figure 9A:
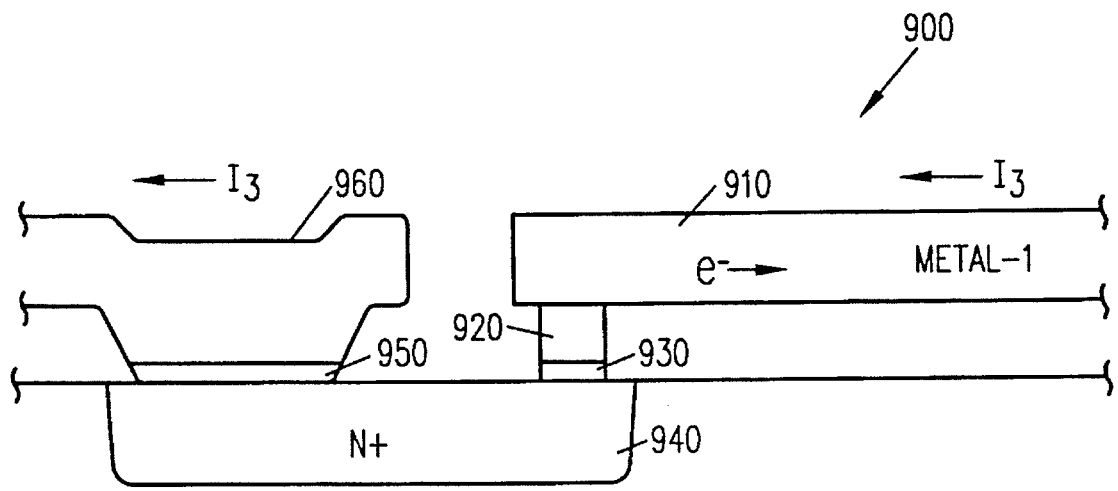
FIGS. 9A and 9B illustrate a test methodology testing a diffusion contact according to another embodiment of the present invention.
Figure 9B:
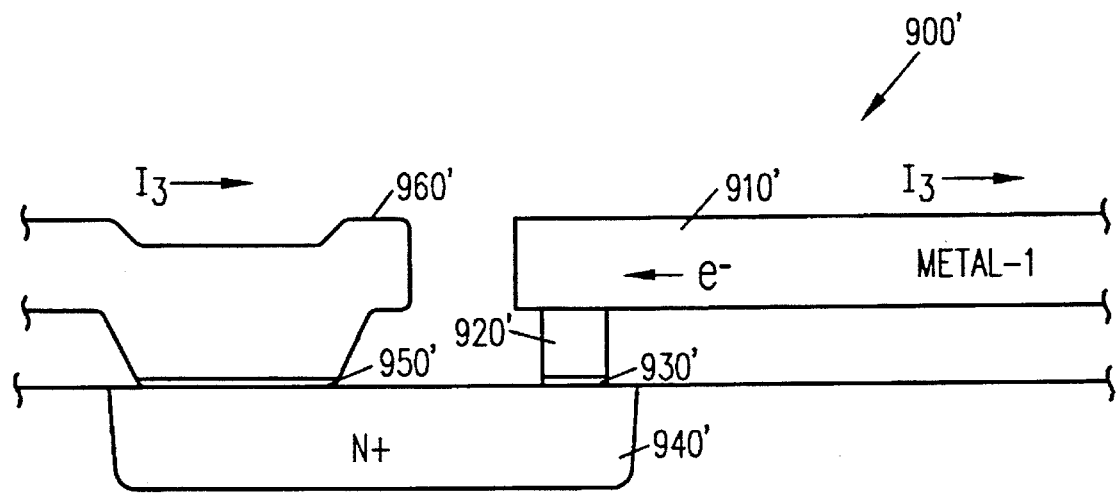

FIGS. 9A and 9B show another embodiment of the invention, adapted for diffusion contacts. FIG. 9A shows a structure 900 including a diffusion contact. A current $I_3$ is conducted from metal-1 layer 910, through plug 920 and barrier layer 930, to N+ diffusion 940. The current exits diffusion 940 through barrier layer 950 and metal layer 960. The surface area of metal layer 960 and barrier layer 950 contacting N+ diffusion 940 is very large relative to the surface area of plug 920 and barrier layer 930 contacting N+ diffusion 940. As a result, the effect of metal layer 960 on the lifetime of structure 900 is negligible.

Similarly, FIG. 9B shows a substantially identical structure 900' with a plug 920' and barrier layer 930' connecting metal-1 layer 910' with N+ diffusion 940'. However, in structure 900', current $I_3$ is conducted in the reverse direction.

In this embodiment, current $I_3$ is a substantially constant 20 mA, and the structures are heated to approximately 175° C. The failure criterion is a 4% increase in resistance. Although voids due to electromigration are not likely to occur in N+ diffusion 940' with reverse current, the thickness of barrier layer 930' still has some affect on the speed and lifetime of structure 900' in the reverse current direction. Thus, it is useful to test structure 900' in both current directions and with different thickness of barrier layer 930' to determine an optimal barrier layer thickness.

The foregoing has described the principles and preferred embodiments of the present invention. However, the invention should not be construed as being limited to the particular embodiments described. For example, different types of interconnect structures having a barrier layer can be tested (e.g., with or without a plug). Also, the interconnect between different metal layers of a structure containing more than two metal layers may be tested. Further, the resistance of the barrier layer may be varied by methods other than varying the barrier layer's thickness (e.g., using different materials for the barrier layer). Still further, the test structures may be stressed under conditions different from those described above. Thus, the above-described embodiments should be regarded as illustrative rather than restrictive. Variations can be made to those embodiments by workers skilled in the art without departing from the scope of the present invention as defined by the following claims.

We claim:

1. A method for determining the effect of electromigration on a type of structure for conducting current, wherein said type of structure comprises a first conductor, a second conductor, and a conductive barrier layer connecting said first and second conductor, said method comprising the steps of:

providing a first test structure substantially identical to said type of structure;

conducting a first current from the first conductor of said first test structure to the second conductor of said first test structure;

measuring a lifetime of said first test structure;

providing a second test structure substantially identical to said first test structure;

conducting a second current from the second conductor of said second test structure to the first conductor of said second test structure; and measuring a lifetime of said second test structure.

2. The method of claim 1, further comprising the steps of:

heating said first test structure while performing said step of conducting a first current; and heating said second test structure while performing said step of conducting a second current.

3. The method of claim 1, wherein said step of conducting a first current comprises a step of providing a substantially constant current, and said step of conducting a second current comprises a step of providing a current substantially equal in magnitude to said first current.

4. The method of claim 3, wherein said step of measuring a lifetime of said first test structure comprises a step of measuring a change in resistance of said first test structure; and wherein said step of measuring a lifetime of said second test structure comprises a step of measuring a change in resistance of said second test structure.

5. A method for designing a barrier layer in a type of structure for conducting current, said structure comprising a first conductor and a second conductor, said conductive barrier layer connecting said first and second conductor, said method comprising the steps of:

providing a first test structure substantially identical to said type of structure and having a barrier layer with a first resistance;

conducting a first current from the first conductor of said first test structure to the second conductor of said first test structure;

measuring a lifetime of said first test structure;

providing a second test structure substantially identical to said first test structure; and conducting a second current from the second conductor of said second test structure to the first conductor of said second test structure;

measuring a lifetime of said second test structure;

providing a third test structure substantially identical to said second test structure but having a conductive barrier layer of a second resistance, said second resistance being different from said first resistance;

conducting a third current from the first conductor of said third test structure to the second conductor of said third test structure;

measuring a lifetime of said third test structure;

providing a fourth test structure substantially identical to said third test structure;

conducting a fourth current from the second conductor of said fourth test structure to the first conductor of said fourth test structure; and measuring a lifetime of said fourth test structure.

6. The method of claim 5, further comprising the steps of:

heating said first test structure while performing said step of conducting a first current;

heating said second test structure while performing said step of conducting a second current;

heating said third test structure while performing said step of conducting a third current;

heating said fourth test structure while performing said step of conducting a fourth current.

7. The method of claim 5, wherein:

said step of conducting a first current comprises a step of providing a substantially constant current;

said step of conducting a second current comprises a step of providing a current substantially equal in magnitude to said first current;

said step of conducting a third current comprises a step of providing a current substantially equal in magnitude to said first current; and said step of conducting a fourth current comprises a step of providing a current substantially equal in magnitude to said first current.

8. The method of claim 5, wherein said step of providing a third test structure comprises a step of providing a barrier layer having a thickness different from the thickness of said barrier layer in said first test structure.

9. The method of claim 5, wherein said step of providing a third test structure comprises a step of providing a barrier layer of a material different from the material of said barrier layer in said first test structure.

10. The method of claim 9, wherein said step of measuring the lifetime of said first test structure comprises a step of measuring a change in resistance of said first test structure.

11. A system for designing a barrier layer in a type of structure for conducting current, said type of structure for conducting current comprising a first conductor and a second conductor, said conductive barrier layer connecting said first and second conductor, said system comprising:

a first test structure substantially identical to said type of structure and having a barrier layer with a first resistance;

means for conducting a first current from the first conductor of said first test structure to the second conductor of said first test structure;

means for measuring a lifetime of said first test structure;

a second test structure substantially identical to said first test structure; and means for conducting a second current from the second conductor of said second test structure to the first conductor of said second test structure;

means for measuring a lifetime of said second test structure;

a third test structure substantially identical to said second test structure but having a conductive barrier layer of a second resistance, said second resistance being different from said first resistance;

means for conducting a third current from the first conductor of said third test structure to the second conductor of said third test structure;

means for measuring a lifetime of said third test structure;

a fourth test structure substantially identical to said third test structure;

means for conducting a fourth current from the second conductor of said fourth test structure to the first conductor of said fourth test structure; and means for measuring a lifetime of said fourth test structure.

12. The system of claim 11, wherein:

said means for conducting a first current comprises means for providing a substantially constant current;

said means for conducting a second current comprises means for providing a current substantially equal in magnitude to said first current;

said means for conducting a third current comprises means for providing a current substantially equal in magnitude to said first current; and said means for conducting a fourth current comprises means for providing a current substantially equal in magnitude to said first current.

13. The system of claim 11, wherein said barrier layer of said third test structure has a thickness different from the thickness of said barrier layer in said first test structure.

14. The system of claim 11, wherein said barrier layer of said third test structure is comprised of a material different from the material of said barrier layer in said first test structure.

15. The system of claim 11, wherein said structure for conducting current further comprises a plug connected between said second conductor and said conductive barrier layer.

16. The system of claim 11, wherein said first conductor is a diffusion contact.

17. A method for predicting the time to failure of a type of structure comprising a first conductor, a barrier layer on said first conductor, a second conductor, and a conductive plug between said barrier layer and said second conductor, comprising the steps of:

provproviding a statistically significant first number of said type of structures;

conducting a first current through each of said first number of said type of structures from the first conductor to the second conductor through said conductive plug and said barrier layer;

measuring a lifetime of said first number of said type of structures;

providing a statistically significant second number of said type of structures;

conducting a second current through each of said second number of said type of structures from the second conductor to the first conductor through said barrier layer and said conductive plug; and measuring a lifetime of said second number of said type of structures.

18. The method of claim, 17, further comprising the steps of:

heating said first number of said type of structures while performing said step of conducting a first current; and heating said second number of said type of structures while performing said step of conducting a second current.

19. The method of claim 18, wherein said step of conducting a first current comprises a step of providing a substantially constant current, and said step of conducting a second current comprises a step of providing a current substantially equal in magnitude to said first current.

20. The method of claim 19:

wherein said step of measuring a lifetime of said first number of said type of structures comprises a step of measuring a change in resistance of each of said first number of said type of structures; and wherein said step of measuring a lifetime of said second number of said type of structures comprises a step of measuring a change in resistance of each of said second number of said type of structures.

21. The method of claim 20:

wherein said step of measuring a lifetime of said first number of said type of structures further comprises a step of determining a time when a first selected percentage of said first number of said type of structures achieves an increase in resistance by a second selected percentage; and wherein said step of measuring a lifetime of said second number of said type of structures further comprises a step of determining a time when said first selected percentage of said second number of said type of structures achieves an increase in resistance by the second selected percentage.

22. The method of claim 21:

wherein the step of conducting a first current further comprises conducting a first current of approximately 75 mA; and wherein the step of conducting a second current further comprises conducting a second current of approximately 75 mA.

23. The method of claim 22:

wherein the step of measuring a lifetime of said first number of said type of structures comprises determining a time when 50% of said first number of said type of structures achieves an increase in resistance by the second selected percentage; and wherein the step of measuring a lifetime of said second number of said type of structures comprises determining a time when 50% of said second number of said type of structures achieves an increase in resistance by the second selected percentage.

24. The method of claim 23:

wherein the step of measuring a lifetime of said first number of said type of structures comprises determining a time when 50% of said first statistically significant number of said type of structures achieves an increase in resistance of 20%; and wherein the step of measuring a lifetime of said second number of said type of structures comprises determining a time when 50% of said second number of said type of structures achieves an increase in resistance of 20%.

25. The method of claim 24:

wherein the step of heating said first number of said type of structures while performing said step of conducting a first current comprises heating said first number of said type of structures to a temperature of 175° C.; and wherein the step of heating said second number of said type of structures while performing said step of conducting a second current comprises heating said second number of said type of structures to a temperature of 175° C.

26. A method for determining an optimal barrier layer thickness in a type of structure comprising a first conductor, a barrier layer on said first conductor, a second conductor, and a conductive plug between said barrier layer and said second conductor, comprising the steps of:

providing a statistically significant first number of said type of structures having a barrier layer of a first thickness;

conducting a first current through each of said first number of said type of structures from the first conductor to the second conductor through said conductive plug and said barrier layer of a first thickness;

measuring a lifetime of said first number of said type of structures;

providing a statistically significant second number of said type of structures having a barrier layer of the first thickness;

conducting a second current through each of said second number of said type of structures from the second conductor to the first conductor through said barrier layer of the first thickness and said conductive plug;

measuring a lifetime of said second number of said type of structures;

providing a statistically significant third number of said type of structures having a barrier layer of a second thickness;

conducting a third current through each of said third number of said type of structures from the first conductor to the second conductor through said conductive plug and said barrier layer of a second thickness;

measuring a lifetime of said third number of said type of structures;

providing a statistically significant fourth number of said type of structures having a barrier layer of the second thickness;

conducting a fourth current through each of said fourth number of said type of structures from the second conductor to the first conductor through said barrier layer of a second thickness and said conductive plug;

measuring a lifetime of said fourth number of said type of structures.

27. The method of claim 26, further comprising the steps of:

heating said first number of said type of structures while performing said step of conducting a first current;

heating said second number of said type of structures while performing said step of conducting a second current;

heating said third number of said type of structures while performing said step of conducting a third current; and heating said fourth number of said type of structures while performing said step of conducting a fourth current.

28. The method of claim 27, wherein:

said step of conducting a first current comprises a step of providing a substantially constant current in a direction defined as a reverse direction;

said step of conducting a second current comprises a step of providing a current substantially equal in magnitude to said first current and in a direction defined as a forward direction opposite in direction to said first current;

said step of conducting a third current comprises a step of providing a current substantially equal in magnitude to said first current and in the reverse direction; and said step of conducting a fourth current comprises a step of providing a current substantially equal in magnitude to said first current and in the forward direction.

29. The method of claim 28:

wherein said step of providing a third number of said type of structures having a second thickness comprises a step of providing a barrier layer having said second thickness greater than said first thickness.

30. The method of claim 29:

wherein said step of measuring a lifetime of said first number of said type of structures comprises a step of measuring a change in resistance of each of said first number of said structures;

wherein said step of measuring a lifetime of said second number of said type of structures comprises a step of measuring a change in resistance of each of said second number of said structures;

wherein said step of measuring a lifetime of said third number of said type of structures comprises a step of measuring a change in resistance of each of said third number of said structures; and wherein said step of measuring a lifetime of said fourth number of said type of structures comprises a step of measuring a change in resistance of each of said fourth number of said structures.

31. The method of claim 30:

wherein said step of measuring a lifetime of said first number of said type of structures further comprises a step of determining a time when a first selected percentage of said first number of said type of structures achieves an increase in resistance by a second selected percentage;

wherein said step of measuring a lifetime of said second number of said type of structures further comprises a step of determining a time when the first selected percentage of said second number of said type of structures achieves an increase in resistance by the second selected percentage;

wherein said step of measuring a lifetime of said third number of said type of structures further comprises a step of determining a time when the first selected percentage of said third number of said type of structures achieves an increase in resistance by the second selected percentage; and wherein said step of measuring a lifetime of said fourth number of said type of structures further comprises a step of determining a time when the first selected percentage of said fourth number of said type of structures achieves an increase in resistance by the second selected percentage.

32. The method of claim 31, wherein the step of conducting a first current further comprises conducting a first current of approximately 75 mA.

33. The method of claim 32:

wherein the step of measuring a lifetime of said first number of said type of structures comprises determining a time when 50% of said first number of said structures achieves an increase in resistance by the second selected percentage;

wherein the step of measuring a lifetime of said second number of said type of structures comprises determining a time when 50% of said second number of structures achieves an increase in resistance by the second selected percentage;

wherein the step of measuring a lifetime of said third number of said type of structures comprises determining a time when 50% of said third number of structures achieves an increase in resistance by the second selected percentage; and wherein the step of measuring a lifetime of said fourth number of said type of structures comprises determining a time when 50% of said fourth number of said structures achieves an increase in resistance by the second selected percentage.

34. The method of claim 33:

wherein the step of measuring a lifetime of said first number of said type of structures comprises determining a time when 50% of said first number of said type of structures achieves an increase in resistance of 20%;

wherein the step of measuring a lifetime of said second number of said type of structures comprises determining a time when 50% of said second number of said type of structures achieves an increase in resistance of 20%;

wherein the step of measuring a lifetime of said third number of said type of structures comprises determining a time when 50% of said third number of said type of structures achieves an increase in resistance of 20%; and wherein the step of measuring a lifetime of said fourth number of said type of structures comprises determining a time when 50% of said fourth number of said type of structures achieves an increase in resistance of 20%.

35. The method of claim 34:

wherein the step of heating said first number of said type of structures comprises heating said first number of said type of structures to a temperature of 175° C.;

wherein the step of heating said second number of said type of structures comprises heating said second number of said type of structures to a temperature of 175° C.;

wherein the step of heating said third number of said type of structures comprises heating said third number of said type of structures to a temperature of 175° C.; and wherein the step of heating said fourth number of said type of structures comprises heating said fourth number of said type of structures to a temperature of 175° C.

36. The method of claim 35, further comprising a step of determining an optimal barrier thickness between the first barrier thickness and the second barrier thickness wherein said optimal barrier thickness is defined when a lifetime with current flowing in the forward direction is equal to a lifetime with current flowing in the reverse direction.

* * * * *